(12) United States Patent
Jacobsen et al.

(10) Patent No.: US 6,576,406 B1
(45) Date of Patent: Jun. 10, 2003

(54) MICRO-LITHOGRAPHIC METHOD AND APPARATUS USING THREE-DIMENSIONAL MASK

(75) Inventors: Stephen C. Jacobsen, Salt Lake City, UT (US); David L. Wells, Salt Lake City, UT (US)

(73) Assignee: Sarcos Investments LC

( * ) Notice: Subject to any disclaimer, the term of this patent is extended or adjusted under 35 U.S.C. 154(b) by 0 days.

(21) Appl. No.: 09/606,815

(22) Filed: Jun. 29, 2000

(51) Int. Cl.[7] .............................. G03F 7/00; G03F 7/24
(52) U.S. Cl. ......................... 430/322; 430/5; 430/311; 118/218; 216/9; 216/10; 216/41
(58) Field of Search ........................... 430/5, 311, 322; 118/218; 216/41, 9, 10

(56) References Cited

U.S. PATENT DOCUMENTS

| | | | |
|---|---|---|---|
| 4,233,108 A | * 11/1980 | Tamura et al. | 156/637 |
| 5,106,455 A | 4/1992 | Jacobsen et al. | 156/659.1 |
| 5,269,882 A | 12/1993 | Jacobsen | 156/659.1 |
| 5,270,485 A | 12/1993 | Jacobsen | 174/15.1 |
| 5,273,622 A | 12/1993 | Jacobsen | 156/659.1 |
| 5,481,184 A | 1/1996 | Jacobsen | 324/106 |
| 5,767,824 A | * 6/1998 | Jacobsen | 345/55 |
| 5,770,123 A | * 6/1998 | Hatakeyama et al. | 264/1.21 |
| 5,951,881 A | * 9/1999 | Rogers et al. | 216/41 |
| 6,063,200 A | * 5/2000 | Jacobsen et al. | 118/718 |
| 6,066,361 A | * 5/2000 | Jacobsen et al. | 427/163.2 |
| 6,136,480 A | * 10/2000 | Pierrat | 430/5 |
| 6,245,630 B1 | * 6/2001 | Ishikawa | 438/393 |
| 6,294,020 B1 | * 9/2001 | Luthje et al. | 118/218 |

* cited by examiner

Primary Examiner—Janet Baxter
Assistant Examiner—Amanda C. Walke
(74) Attorney, Agent, or Firm—Thorpe North & Western, LLP

(57) ABSTRACT

A micro-lithographic apparatus and method for selectively exposing/masking resist material on a non-planer workpiece or filamentary substrate includes a hollow, energy transparent tubular member with a hollow for containing the workpiece. The tubular member is selectively coated with a layer of energy-opaque material to form the desired pattern. The transparent tube and opaque coating selectively expose/mask the resist material on the workpiece. Alternatively, the apparatus and method include an energy opaque tubular member with apertures formed through the walls of the tubular member. The apertures form the desired pattern. The opaque tube with apertures selectively exposes/masks the resist material. The apparatus and method may also include an energy source and a rotating device for rotating the tubular member, with the workpiece disposed therein, to the energy source or rotating energy source around tubular member or have energy source surround tubular member.

15 Claims, 2 Drawing Sheets

US 6,576,406 B1

MICRO-LITHOGRAPHIC METHOD AND APPARATUS USING THREE-DIMENSIONAL MASK

BACKGROUND OF THE INVENTION

1. Field of the Invention

The present invention relates to a micro-lithographic method and apparatus for non-planar workpieces. More particularly, the present invention relates to a micro-lithographic method and apparatus using an energy transparent tubular member selectively coated with an energy opaque layer to selectively expose/mask a resist material on a non-planar workpiece to an energy source. It can also be a physical mask such that material deposition (such as sputtering) is done through the aperture and blocked by the rest of the mask to form the pattern with actual deposited material instead of exposing a layer of resist over material to be etched later.

2. Prior Art

Lithographic techniques have been utilized for some time in the manufacture especially of integrated circuit boards and semiconductor devices and related products. The products manufactured have typically included planar surfaces to which the lithographic techniques were applied. Such techniques have proven extremely effective in the precise manufacturing and formation of very small details in the product. However, attempts to apply such techniques to other than planar surfaces have proven difficult, if not unachievable, until recently. With recent developments in nonplanar lithography, the fabrication of microstructures, including both three-dimensional mechanical parts and three-dimensional electrical components, has become more readily achievable. U.S. Pat. No. 5,106,455, issued Apr. 21, 1992, to Jacobsen et al., which is herein incorporated by reference, discloses a method and apparatus for fabricating microstructures using nonplanar, exposure beam lithography. Using this method and apparatus, very fine, precise and detailed physical structures can be formed on very small three-dimensional objects such as, for example, cylinders. U.S. Pat. No. 5,269,882, issued Dec. 14, 1993, to Jacobsen, which is herein incorporated by reference, discloses a method and apparatus for fabricating thin-film semiconductor devices using nonplanar, exposure beam lithography. In particular, a variety of semiconductor devices can be formed on three-dimensional substrates, again such as cylinders. The methods and apparatus disclosed in the above two patents provide for fabrication of individual microstructures or thin-film semiconductor devices in a type of batch processing approach. U.S. Pat. No. 5,273,622, issued Dec. 29, 1993, to Jacobsen, which is herein incorporated by reference, discloses a continuous processing approach for fabricating microstructures and thin-film semiconductor devices. Such microstructures are finding use in a variety of areas including medical devices, robotics, navigation equipment, motors and similar equipment. U.S. Pat. No. 5,481,184, issued Jan. 2, 1996, to Jacobsen, which is herein incorporated by reference, discloses a system for movement actuators and sensors on very small mechanical parts, such as fibers and filaments. U.S. Pat. No. 5,270,485, issued Dec. 14, 1993, to Jacobsen, which is herein incorporated by reference, discloses a three-dimensional circuit structure with electrical components formed on the surfaces of elongated cylindrical substrates. With the development of these very small (termed "micro") mechanical devices and electrical elements, the ability to fabricate detailed features of such devices and elements in an efficient and precise way is greatly desired.

The problems faced in fabricating detailed features of these microstructures include the extremely small size of the features and structures and also the nonplanar nature of the structures. In addition, the structures may be relatively long and flexible. Furthermore, the fabrication process can also be very time consuming. For example, resist material is deposited on filamentary substrates which is patterned by exposing the resist material to an energy beam. The substrates are processed one at a time and the resist material is exposed by "writing" the pattern on the substrate with the energy beam. This process of writing the patterns on the substrates and processing the substrates one at a time is very time consuming. Therefore, faster fabrication methods are desired.

SUMMARY OF THE INVENTION

It is a feature of the present invention to provide a method and apparatus for fabricating microstructures utilizing lithographic techniques.

It is another feature of the present invention to provide such a method and apparatus which allows the fabrication of details over nonplanar surface areas of a workpiece, or filamentary substrate.

It is yet another feature of the present invention to provide such a method and apparatus in which the whole pattern in a resist material may be exposed all at once, or nearly all at once.

It is a further feature of the present invention to provide a method and apparatus for direct deposition of material on a non-planar workpiece in a desired pattern.

These and other features and advantages of the present invention are realized in an apparatus having an energy-transparent tubular member with a hollow for receiving a filamentary substrate and a layer of energy-opaque material selectively coating the tubular member to form the desired pattern. The filamentary substrate is coated with an energy resist material. The tubular member is made of a material that is transparent to the type of energy used and has an elongated hollow for holding the filamentary substrate. The layer of material coating of the tubular member (either on the outside or inside of the tubular member) is opaque to the type of energy used and is patterned to selectively mask portions of the resist material on the filamentary substrate.

The apparatus may also include an energy source for exposing the resist and a collet or holding device for holding the tubular member. The collet may be coupled to a motor for rotating the tubular member and filamentary substrate before the energy source. Alternatively, the holding device may be configured to be disposed in a fixture for exposing the resist.

An alternative embodiment of the apparatus has an energy-opaque tubular member with a hollow for receiving a filamentary substrate and apertures formed in the walls of the tubular member to form the desired pattern. In this embodiment, the tubular member is made of a material that is opaque to the type of energy used, rather than transparent.

Another alternative embodiment of the invention is to provide a physical mask that blocks the applied energy from reaching a filamentary substrate except for areas that have apertures formed in the mask.

These and other objects, features, advantages and alternative aspects of the present invention will become apparent to those skilled in the art from a consideration of the following detailed description taken in combination with the accompanying drawings.

DETAILED DESCRIPTION OF THE INVENTION

Reference will now be made to the drawings in which the various elements of the present invention will be given numerical designations and in which the invention will be discussed so as to enable one skilled in the art to make and use the invention.

The present invention relates to a micro-lithographic method and apparatus for non-planar workpieces. The workpiece is a non-planar, three-dimensional substrate which will be coated with a resist material in a desired pattern prior to etching or material deposition in the lithographic process. Thus, the workpiece may be a rod, bar, fiber, or filament. The workpiece may or may not be cylindrical, but is non-planar or three-dimensional. The workpiece may be formed by the lithographic process into a microstructure or a three-dimensional electrical component. The microstructures include three-dimensional mechanical parts, such as filamentary sensors and actuators. The three-dimensional electrical component may be a nonplanar semiconductor device. The workpiece may be a polymer fiber, a metal filament or fiber, a ceramic fiber, or a glass fiber or any other material forming a rod or filament. The terms "workpiece" and "filamentary substrate" are used interchangeably to refer to the non-planar, three-dimensional substrate.

Figure 1:
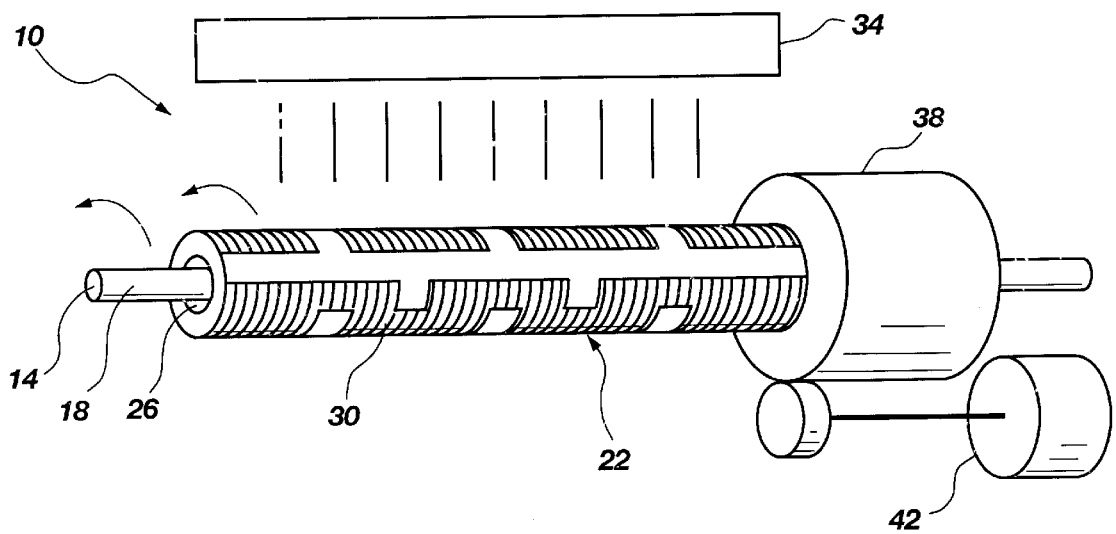
FIG. 1 is a perspective view of a preferred embodiment of an apparatus for exposing/masking resist material on a filamentary substrate of the present invention.

As illustrated in FIG. 1, a preferred embodiment of a micro-lithographic apparatus 10 for selectively exposing/masking resist material on a non-planar filamentary substrate to an energy source in a desired pattern is shown. As described above, the filamentary substrate 14 is a non-planar, three-dimensional workpiece coated with a resist material 18.

The apparatus 10 advantageously includes a hollow, energy-transparent tubular member 22 or cylindrical sleeve. The tubular member 22 is made of a material that is transparent to the type of energy being used to expose the resist material 18 on the filamentary substrate 14. Thus, the tubular member 22 may be optically transparent if the exposure energy is optical, but may not be optically transparent if the exposure energy is something other than optical. Preferably, the tubular member is a quartz tube.

The tubular member 22 has a generally axially disposed hollow 26 or bore extending therethrough. The hollow 26 receives and contains the filamentary substrate 14. The hollow 26 is preferably sized so the filamentary substrate 14 substantially fills the hollow or so that there is little or no gap between the inside surface of the tubular member and the filamentary substrate. In addition, the hollow 26 preferably is sized so that the filamentary substrate may be slid in and out of the tubular member without breaking the filamentary substrate or damaging the resist coating.

A layer 30 of energy-opaque material advantageously selectively coats the tubular member 22 to form the desired pattern. The layer 30 or material is opaque to the type of energy being used to expose the resist material 18 on the filamentary substrate 14. Thus, the layer 30 may be optically opaque if the exposure energy is optical, but may not be optically opaque if the exposure energy is something other than optical. Preferably, the layer 30 of material is a layer of chrome.

As discussed above, the layer 30 of material selectively coats the tubular member 22, or is patterned, to form coated and uncoated regions or sections on the tubular member 22. The coated regions of the tubular member 22 block or mask portions of the resist material on the filamentary substrate 14. Thus, the coated regions of the tubular member 22 prevent exposure of the resist material outside of the desired pattern. The uncoated sections of the tubular member 22 allow the resist material to be exposed. Therefore, the transparent tube and patterned, opaque coating advantageously selectively allow portions of the resist material on the filamentary substrate to be exposed to and masked from, respectively, an energy source, creating a desired pattern in the resist coating on the workpiece which through subsequent processing development (etching deposition, etc.) can be used to create a microstructure within or on the workpiece.

The apparatus of the present invention represents a significant improvement over the prior art. The prior art exposed the resist material in the desired pattern by the time consuming process of "writing" the pattern with an energy beam. In addition, the prior art was only capable of exposing one workpiece at a time. The apparatus of the present invention, however, allows the resist material on the filamentary substrate to be exposed to an energy source all at once, or nearly at once. In addition, the apparatus of the present invention allows batch processing of several workpieces at once, each disposed in a respective tubular member.

The apparatus 10 may also include an energy source 34 for exposing the resist material 18 on the filamentary substrate 14. The energy source 34 is preferably an ultra-violet (UV) source, such as a vapor lamp. However, other energy sources are possible such as e-beam, x-ray, ion beam, extreme ultra violet and UV laser. In addition, the energy source 34 may be planar, as shown, or may be circular, or cylindrical, to expose all areas of the exposed or unmasked portions of the resist.

In addition, the apparatus 10 may have a collet 38 or similar holding device for holding the tubular member 22. The collet 38 may be adapted for disposing in a fixture device (not shown). The collet 38 or holding device may be formed integrally with the tubular member, or may be detachably coupled to the tubular member and capable of receiving various different tubular members.

Figure 2:
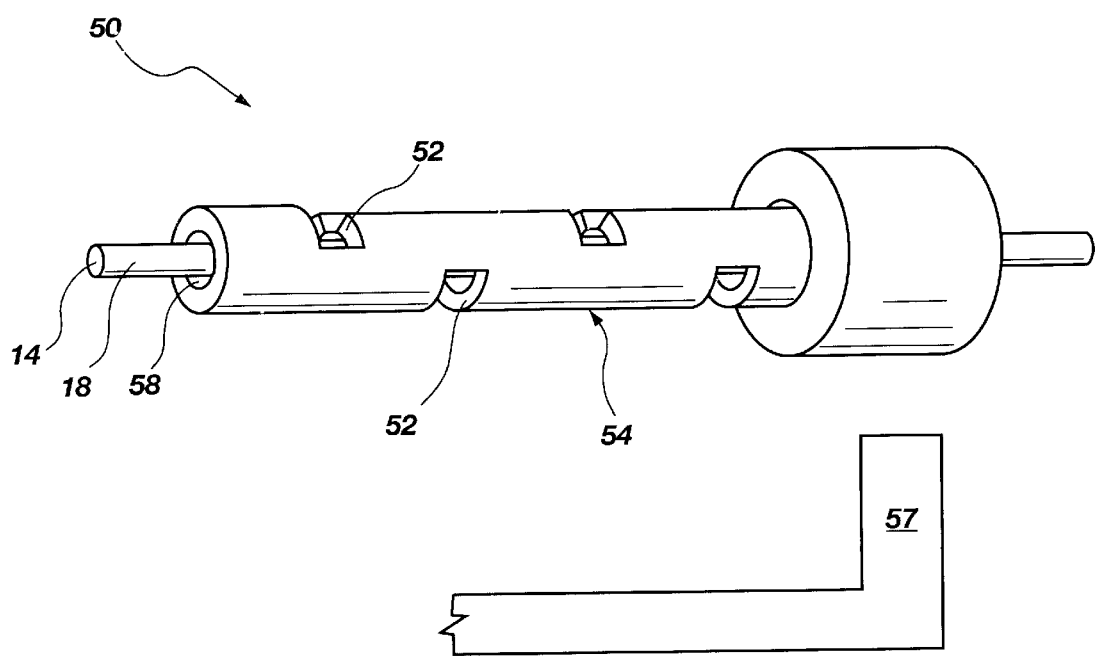
FIG. 2 is a perspective view of an alternative embodiment of an apparatus for exposing/masking resist material on a filamentary substrate of the present invention.

Also, the apparatus may have end caps or other fixtures 57, as illustrated in FIG. 2, which hold and/or align the workpiece with the ends of the tubular member 22 and center it within the hollow 16 (this improves pattern quality). The fixtures also allow the workpiece (which may have a pattern on it already) to be aligned/registered with pattern/mask on tubular member 22 to enable multi-layer microfabrication.

Furthermore, the apparatus 10 may include a gear/motor 42 or fixture for rotating the tubular member 22. The gear/motor combination 42 rotates the tubular member 22, with the filamentary substrate therein, to expose all the uncoated regions of the tubular member, or all the unmasked portions of the filamentary substrate, to the energy source.

Alternatively, the collet 34 may be disposed in a fixture (not shown) which rotates the tubular member and filamentary substrate.

A method of fabricating the apparatus of the above embodiment includes first coating an energy-transparent, hollow tube with an energy-opaque material. As discussed above, the tube may be made of a quartz material and coated with a chrome material. The energy-opaque material is then patterned. The energy-opaque material may be patterned using standard prior art techniques, such as exposing the desired pattern by writing the pattern with an energy beam; developing the pattern exposed; and either removing the energy-opaque material in the pattern desired where it has been exposed by the developed pattern or by later depositing/adding energy-opaque material in the areas exposed by the developed pattern which previously were not coated by energy-opaque material. The pattern can be exposed in a resist coating or can be directly created using a laser-assisted chemical vapor deposition/removal process.

Although the above apparatus has been described and illustrated as having a quartz tube with a chrome coating and a UV energy source, it is of course understood that other tube materials, coating materials, and types of energy sources may be used.

Figure 3:
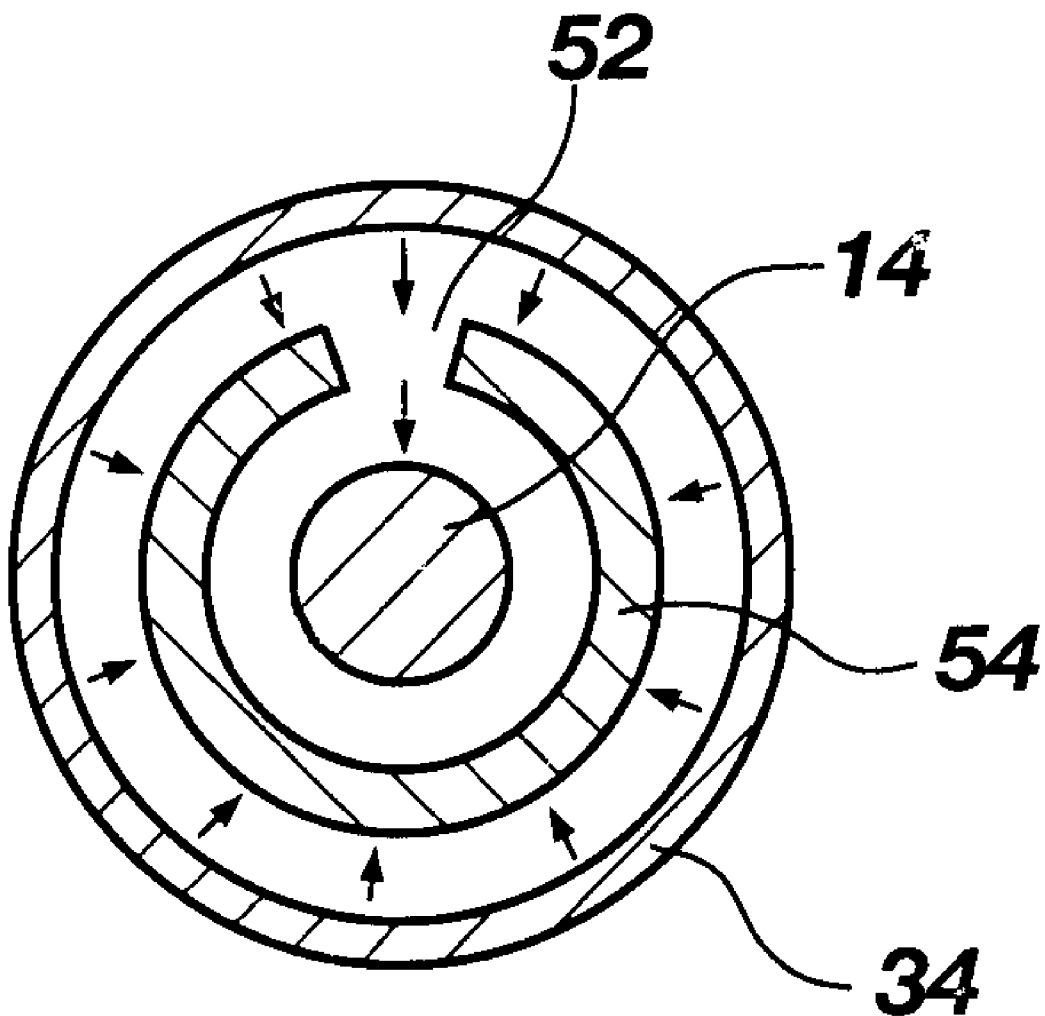
FIG. 3 is a cross-sectional view end view of FIG. 2 with the energy source being applied.

As illustrated in FIGS. 2 and 3, an alternative embodiment of a micro-lithographic apparatus 50 for selectively exposing/masking resist material on a non-planar filamentary substrate to an energy source in a desired pattern is shown. Similarly to the above embodiment, the apparatus 50 has a tubular member 54 with a generally axially disposed hollow 58 extending therethrough for containing the filamentary substrate 14. The tubular member 54 is made of an energy-opaque material, as opposed to an energy transparent material as above. The tubular member 54 has an aperture 52 extending through a wall of the tubular member to the hollow 58. The wall of the tubular member 54 and the aperture 52 form the desired pattern. A plurality of apertures may be used to achieve the desired pattern.

In this embodiment, the wall of the tubular member 54 and the aperture 52 are patterned to form masked and unmasked regions or sections. The masked regions of the tubular member 54 block or mask portions of the resist material on the filamentary substrate 14. Thus, the masked regions of the tubular member 54 prevent exposure of the resist outside of the desired pattern. The unmasked sections allow the resist material to be exposed. Therefore, the opaque tube and patterned aperture 52 work together to allow portions of the resist material on the filamentary substrate 14 to be masked from and exposed to, an energy source. The apparatus of the alternative embodiment may be made by machining or etching or ablating, etc. the aperture into the tubular member. Support member or fixture 57 supports any and all portions o apparatus 50 needing support for proper operation.

The tubular members of the above apparatuses form cylindrical masks or sleeves. Although the above embodiments have been described and illustrated with respect to cylindrical, or round, filamentary substrates and tubular members, it is of course understood that the tubular members may be any other shape. It is noted that materials can be coated onto filament 14 through apertures 52.

An illustrative lithographic process for use with the above apparatuses first includes cleaning the workpiece, or filamentary substrate, using a solvent such as acetone and two-propanol, or using a hydrogen peroxide cycle or RCA-type clean. The workpiece may then be coated with an adhesion promoter which improves the ability of the resist material to adhere to the workpiece. The resist material is then applied to the workpiece by simply dipping the workpiece in a solution of the resist (other coating methods are possible, e.g., spray coating). The resist may then be set by soft-baking the workpiece in a convection oven.

The workpiece is then placed in a cylindrical mask or sleeve. The workpiece may be placed in the energy-transparent tube which is selectively coated with an energy-opaque material forming the desired pattern. Also, the apertures can be used for placing materials onto the workpiece in a pattern. Alternatively, the workpiece may be placed in an energy-opaque tube with apertures forming the desired pattern. The tube, with the workpiece therein, is then exposed to an energy exposure source to expose the unmasked portions of the resist material. In addition, the tube or sleeve, with the workpiece disposed therein, may also be rotated to expose all the unmasked portions of the resist material or energy exposure source may be rotated about the sleeve, or exposure source may encompass or surround the sleeve.

After exposure is completed, the exposed resist is developed. During the development of the exposed pattern, the resist exposed to the energy is removed (positive lithography) or all the other resist except which was exposed to the energy is removed (negative lithography). The workpiece may then be baked again in a convection oven. The workpiece is now ready for etching or deposition. For etching, the workpiece is exposed to an appropriate etching agent. In positive lithography, the pattern would be etched directly, whereas in negative lithography, all except the pattern would be etched into the workpiece. Following the etching step, the remaining resist material is removed and the workpiece is either ready for a next step in the fabrication process or is completed. For deposition, a desired material is deposited onto the workpiece, such as by physical vapor deposition (e.g., sputtering, evaporation) or by chemical vapor deposition, electroplating, etc.

The above method is particularly well suited for fabricating micro-structures, such as actuators or sensors. The above apparatuses may also be used for fabricating semiconductor devices or other electrical components.

An illustrative lithographic process for use with the above apparatuses to produce a FET on the workpiece first includes cleaning the workpiece, or filamentary substrate, using a solvent such as acetone and two-propanol, or using a hydrogen peroxide cycle or RCA-type clean. A layer of semiconductor material is then applied to the workpiece using application techniques, such as sputtering and chemical vapor deposition. An insulator material is applied over the semiconductor layer, again by conventional application techniques. An adhesion promoter may be applied to the cylinder over the insulator layer. Then a resist material is applied, such as by dipping the workpiece into a solution of the resist. The resist is then set by soft-baking the workpiece in a convection oven.

The workpiece is then placed in a cylindrical mask or sleeve. The workpiece may be placed in the energy-transparent tube which is selectively coated with an energy-opaque material forming the desired pattern. Alternatively, the workpiece may be placed in an energy-opaque tube with apertures forming the desired pattern. The tube, with the workpiece therein, is then exposed to an energy exposure source to expose the unmasked portions of the resist material. In addition, the tube or sleeve, with the workpiece disposed therein, may also be rotated to expose all the unmasked portions of the resist material.

After exposure is completed, the exposed resist is developed. During the development of the exposed pattern, the resist exposed to the energy is removed (positive lithography). The workpiece may then be baked again in a convection oven. The workpiece is now ready for etching (wet or dry etching) which is carried out by exposing the workpiece to an appropriate etching agent. The insulator is etched/removed from the patterned region down to the semiconductor layer. Following the etching step, the remaining resist material is removed.

To produce the desired transistor, in this case a field effect transistor, the regions of the semiconductor material are doped to produce source and drain regions. The next step is to provide a conductor pattern to allow for applying electrical signals to and receive electrical signals from the transistor. This is done by applying a layer of aluminum or other conductive material to the workpiece. Resist is applied over the layer of conductive material as described above.

The workpiece is again placed in a cylindrical mask or sleeve and aligned to the mask pattern. The workpiece is exposed to the energy source to expose all but the conductor patterns.

After exposure is completed, the resist is developed, leaving resist overlaying only the conductor patterns. The part of the aluminum layer over which the developed resist was removed is then etched, or removed, leaving the aluminum conductor patterns. The remaining resist is removed. The conductor patterns may also be formed using deposition of a conductor material onto resist patterns on the insulator material.

Although the preferred embodiment illustrates the use of a circular cross-sectional rod 14, one skilled in the art would understand that most any shape of rod will work. For example, the rod may have a square cross section, or an oval cross section, or even a cross section that is hollowed out like a donut, and any combination thereof.

It is to be understood that the described embodiments of the invention are illustrative only, and that modifications thereof may occur to those skilled in the art. Accordingly, this invention is not to be regarded as limited to the embodiments disclosed, but is to be limited only as defined by the appended claims herein.

What is claimed is:

1. A method of etching/depositing material on a non-planar, elongated, filamentary workpiece to form a desired pattern, comprising the steps of:
   (a) coating an energy-transparent, hollow tube with an energy-opaque material;
   (b) patterning the energy-opaque material with the desired pattern;
   (c) disposing the non-planar, elongated, filamentary workpiece coated with a resist material in the tube;
   (d) exposing the tube with the workpiece therein to an exposure energy source to expose the pattern in the resist behind the uncoated portions of the tube to the energy source;
   (e) developing the exposed resist on the workpiece; and
   (f) etching/depositing the pattern on the workpiece.

2. The method of claim 1, wherein step (a) further comprises coating a hollow quartz tube with a chrome material.

3. The method of claim 1, wherein step (d) further comprises rotating the tube with the workpiece therein with respect to an exposure energy source to expose the pattern in the resist behind the uncoated portions of the tube.

4. The method of claim 1, further comprising repeating steps (a)–(e) to form a second layer on the workpiece.

5. The method of claim 1, wherein step (d) comprises rotating the energy source around the tube.

6. The method of claim 1, wherein step (c) further comprises substantially filling the tube with the non-planer workpiece.

7. The method of claim 1, wherein step (c) further comprises sliding the non-planer workpiece axially into an axially aligned hollow in the tube.

8. A method of etching/depositing material on an elongated, filamentary substrate to form a desired pattern comprising the steps of:
   (a) applying an energy resist material to the elongated, filamentary substrate;
   (b) disposing the elongated, filamentary substrate in a hollow of an elongated tubular mask selectively patterned with energy-opaque portions and energy-transparent portions;
   (c) exposing the elongated tubular mask with the elongated, filamentary substrate therein to an exposure energy source to expose the resist material behind the energy-transparent portions of the tube to the energy source;
   (d) developing the exposed resist on the elongated, filamentary substrate; and
   (e) etching/depositing the desired pattern on the elongated, filamentary substrate.

9. The method of claim 8, wherein step (b) further comprises substantially filling the hollow of the elongated tubular mask with the elongated, filamentary substrate.

10. The method of claim 8, wherein step (b) further comprises sliding the elongated, filamentary substrate axially into the hollow of the elongated tubular mask.

11. The method of claim 8, wherein step (b) further comprises disposing the elongated, filamentary substrate in a hollow of an elongated tubular mask selectively patterned with energy-opaque portions formed by an energy-transparent tube selectively coated with an energy-opaque material.

12. The method of claim 8, wherein step (b) further comprises disposing the elongated, filamentary substrate in a hollow of an elongated tubular mask selectively patterned with energy-opaque portions and energy transparent portions formed by an energy-opaque tube with an aperture extending through a wall thereof.

13. A method of etching/depositing material on an elongated, filamentary substrate to form a desired pattern comprising the steps of:
   (a) applying an energy resist material to the elongated, filamentary substrate;
   (b) disposing the elongated, filamentary substrate in a hollow of an elongated tubular mask selectively patterned with energy-opaque portions and energy-transparent portions, the hollow being sized so that the elongated, filamentary substrate substantially fills the hollow;
   (c) exposing the elongated tubular mask with the elongated, filamentary substrate therein to an exposure energy source to expose the resist material behind the energy-transparent portions of the tube to the energy source;
   (d) developing the exposed resist on the elongated, filamentary substrate; and
   (e) etching/depositing the desired pattern on the elongated, filamentary substrate.

14. The method of claim 13, wherein step (b) further comprises disposing the elongated, filamentary substrate in a hollow of an elongated tubular mask selectively patterned with energy-opaque portions formed by an energy-transparent tube selectively coated with an energy-opaque material.

15. The method of claim 13, wherein step (b) further comprises disposing the elongated, filamentary substrate in a hollow of an elongated tubular mask selectively patterned with energy-opaque portions and energy transparent portions formed by an energy-opaque tube with an aperture extending through a wall thereof.

* * * * *

UNITED STATES PATENT AND TRADEMARK OFFICE
CERTIFICATE OF CORRECTION

PATENT NO. : 6,576,406 B1
DATED : June 10, 2003
INVENTOR(S) : Stephen C. Jacobsen and David L. Wells It is certified that error appears in the above-identified patent and that said Letters Patent is hereby corrected as shown below:

<u>Title page,</u>
Item [57], ABSTRACT,
Line 2, replace "non-planer" with -- non-planar --.

<u>Column 3,</u>
Line 11, delete "view" first appearance.

<u>Column 5,</u>
Line 54, replace "o" with -- of --.

<u>Column 8,</u>
Lines 4 and 7, replace "non-planer" with -- non-planar --.

Signed and Sealed this

Ninth Day of December, 2003

JAMES E. ROGAN
*Director of the United States Patent and Trademark Office*